United States Patent [19]
Crockett et al.

[11] B 3,990,019
[45] Nov. 2, 1976

[54] POWER AMPLIFIER HAVING PROTECTIVE CIRCUITS

[75] Inventors: William B. Crockett; Otward Mueller, both of Lynchburg, Va.

[73] Assignee: General Electric Company, Lynchburg, Va.

[22] Filed: Feb. 27, 1975

[21] Appl. No.: 553,460

[44] Published under the second Trial Voluntary Protest Program on February 3, 1976 as document No. B 553,460.

[52] U.S. Cl. .............................. 330/207 P; 330/13; 330/29; 330/145
[51] Int. Cl.² .......................................... H03F 3/18
[58] Field of Search ................. 330/13, 15, 29, 145, 330/207 P; 307/202 R

[56] References Cited
UNITED STATES PATENTS
3,596,199  7/1971  Hafler............................ 330/207 P

*Primary Examiner*—James B. Mullins
*Attorney, Agent, or Firm*—James J. Williams

[57] ABSTRACT

An improved circuit is provided for a known amplifier having complementary input transistors in its power output stages for supplying oppositely phased signals in response to an input signal. Output transistors are connected to the input transistors to provide output signals for the amplifier. Normally conducting switching means are connected between one of the output transistors and one of the input transistors. Normally nonconducting switching means are coupled between the one output transistor and the amplifier input. During an overload or overdrive condition, the normally conducting switching means become nonconducting, and this in turn causes the normally nonconducting switching means to become conducting, and thereby limit the output from the amplifier. The improved circuit for the amplifier includes a threshold device which responds to the normally conducting switching means becoming nonconducting and reduces the input signal amplitude, and thereby permits the amplifier to restore itself when the overload or overdrive condition is removed.

9 Claims, 4 Drawing Figures

POWER AMPLIFIER HAVING PROTECTIVE CIRCUITS

BACKGROUND OF THE INVENTION

Our invention relates to an amplifier, and particularly to an improved amplifier for providing relatively high power amplification over a relatively broad range of frequencies.

In some commercial or industrial applications, relatively high power amplification over a relatively wide range of frequencies is required. For example, in industrial carrier systems operating on commercial power lines, such amplifiers may be required to produce as much as 100 or 200 watts of output power over a frequency range between 8 and 500 kilohertz. Because of the reliability requirements placed on such amplifiers, proper operation of the amplifiers is highly desirable, if not absolutely necessary.

Accordingly, a primary object of our invention is to provide a new and improved amplifier that can produce a relatively high output power over a relatively wide range of frequencies.

A relatively specific object of our invention is to provide a new and reliable improved amplifier that is capable of producing output powers in the order of 200 watts over a frequency range between 8 and 500 kilohertz.

A transistorized power amplifier which could be used in the applications mentioned above is described in U.S. Pat. No. 3,596,199 granted July 27, 1971. However, the amplifier described in that patent is primarily designed for high quality audio sound systems. It will be appreciated that such sound systems do not need the reliability and the output power that are required in applications such as described above. Specifically, while the amplifier described in that patent does provide power amplification and protection in the event of overload or overdrive, it does not have an arrangement or feature for reliably restoring the amplifier to normal operation after the overload or overdrive is removed. Restoral of that amplifier depends upon the momentary removal of the input signal, a condition which is very likely to occur in audio sound systems. However, in commercial or industrial applications such as carrier systems, and particularly power line relaying systems, removal of the signal is not likely to occur and might, in fact, be very serious or even disastrous.

Accordingly, another object of our invention is to provide a new and improved amplifier having the desired protection features of known amplifiers, but having a further new and improved feature of being reliably self-restoring once the overload or overdrive condition is removed.

Another relatively specific object of our invention is to provide a new amplifier which has protection circuits for overload or overdrive conditions, and which restore the amplifier to operation once the overload or overdrive condition is removed, even though normal input drive signals may still be applied.

SUMMARY OF THE INVENTION

Briefly, these and other objects are achieved with an amplifier having complementary input transistors connected to an input for the amplifier to produce oppositely phased signals in response to an input signal. The outputs from these complementary input transistors are coupled to serially connected power output transistors from which the output of the amplifier is derived. Normally conducting switching means are connected from one of the output transistors to one of the complementary input transistors, and normally nonconducting switching means are connected from the one output transistor to the amplifier input. These switching means provide overload protection in response to an overload at the output or an overdrive at the input. In accordance with our invention, we provide the amplifier with a threshold circuit or device which senses operation of the protective switching means and which attenuates the input signal so that the amplifier will restore itself once the overload or overdrive condition is removed. Our amplifier may have a single push-pull configuration or a double or bridge push-pull configuration. Thus, we provide a relatively high power, broadband amplifier having protective circuits which operate under overload or overdrive conditions, and which restore the amplifier to normal condition when the overload or overdrive condition is removed.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF PREFERRED EMBODIMENTS

Figure 1:
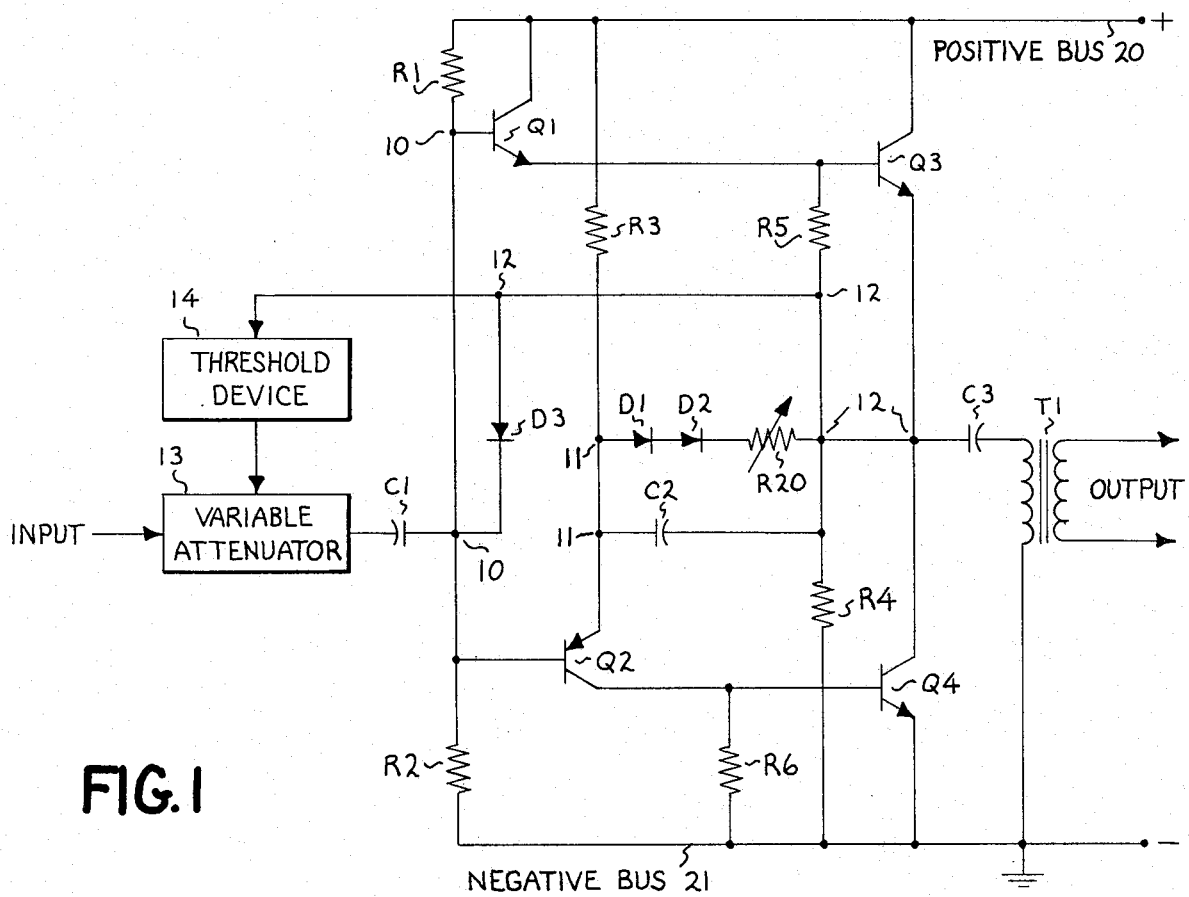
FIG. 1 shows a circuit diagram of one embodiment of an amplifier in accordance with our invention.

For the amplifier circuit of FIG. 1, a direct current source or power supply is provided, and has its positive terminal connected to a positive bus 20 and its negative terminal connected to a negative bus 21 as indicated by the plus and minus signs. The negative bus 21 may be grounded as shown. Relatively low power input signals are applied (through a variable attenuator 13 provided in accordance with our invention) through an input capacitor C1 to an input terminal or point 10. These signals are applied to the bases of complementary input transistors Q1 (NPN type) and Q2 (PNP type). Suitable bias voltages for the input transistors Q1, Q2 are provided by two resistors R1, R2 connected in series between the buses 20, 21. An output from the transistor Q1 is derived by an emitter resistor R5 connected between the emitter of the transistor Q1 and a point 12. An output from the transistor Q2 is derived by a collector resistor R6 connected between the collector of the transistor Q2 and the negative bus 21. The input transistors Q1, Q2 provide oppositely phased signals at their emitter and collector respectively, and these signals are applied to the bases of output power transistors Q3, Q4 respectively. These output transistors Q3, Q4 are respectively connected in series between the bus 20 and the point 12, and between the point 12 and the bus 21 so as to operate class B or class AB. During positive input signals, the transistor Q1 conducts and the transistor Q3 supplies charging current to an output capacitor C3 and the primary winding of an output transformer T1. During negative input signals, the transistor Q2 conducts and the transistor Q4 discharges the output capacitor C3 which supplies current in the opposite direction through the primary winding of the output transformer T1. Amplified output signals are derived from the secondary winding of the transformer T1. As shown in the previously mentioned U.S. Pat. No. 3,596,199, a protection circuit is provided. This circuit includes the series circuit comprising a resistor R3 connected between the positive bus 20 and a point 11, two serially connected diodes D1, D2 and an adjustable resistor R20 connected between the point 11 and the point 12, and a resistor R4 connected between the point 12 and the negative bus 21. An alternating current bypass capacitor C2 is connected across the diodes D1, D2 and the resistor R20. Under normal conditions, direct current flows from the positive bus 20 through the resistor R3, the diodes D1, D2, and the resistor R4 to the negative bus 21. In addition, a normally nonconducting diode D3 is connected between the point 12 and and the point 10 as shown. In this circuit, it should be noted that the resistor R3 is in the emitter-collector path of the transistor Q2, but that the collector of the transistor Q1 is connected directly to the bus 20 so that no corresponding resistor is in the emitter-collector path of the transistor Q1. This feature causes the transistor Q2 to be current limited before the transistor Q1 for a given input signal, and plays an important part in the operation of the circuit, as will be explained.

The circuit as described thus far, other than the variable attenuator 13, is shown and described in U.S. Pat. No. 3,596,199. Reference is made to that patent for one explanation of the circuit operation. In this explanation, several operating conditions have to be considered:
1. Normal operating mode with zero drive voltage. Standby mode.
2. Normal operation with input signal.
3. Overload condition: output stage only.
4. Overdrive condition: output stage.

1. Standby Mode

If the resistor R20 is zero, the voltage at the point 10 is +15 volts, the voltage at the point 11 is +15.7 volts, and the voltage at the point 12 is +14.3 volts. Since the voltage of the point 10 is the base voltage of the transistors Q1, Q2, one can see that the emitter-base junctions of both of these transistors are forward-biased by 0.7 volt. The output transistors Q3, Q4 are not conducting since the voltage drops across the resistors R5, R6 are kept small, i.e. less than the turn-on voltage of the emitter-base junctions of the transistors Q3, Q4. Thus, the power transistors Q3, Q4 are biased for Class B operation, whereas the transistors Q1, Q2 are biased for Class A operation. It is now important to realize that whereas the diodes D1, D2 are forward biased by the bleeder current flowing through them, the diode D3 between the points 10, 11 is reverse biased by 0.7 volt and is therefore nonconducting.

Another important fact is the following: With the diode D3 and the transistors Q3, Q4 being in a nonconducting state, the collector current I1 of the transistor Q1 operating in Class A can be considered to flow through the diodes D1, D2 in a direction opposite to that of the bleeder current I2 in order to reach the emitter of the driver transistor Q2 which is also Class A operated. The ratio of the bleeder current I2 to the collector current I1 is large, for example 10:1. This means that if I2 = 100 ma, then I1 = 10 ma. Neglecting all base currents, the direct current $I_D$ flowing through the diodes D1, D2 is 100 − 10, or 90 ma. The diode current $I_D$ can therefore be considered to be the difference between the bleeder current I2 which is determined by the resistors R3, R4, and the collector current I1 flowing through the transistor Q1. It should be noted that the diodes D1, D2 provide also biasing temperature compensation for the driver transistors Q1, Q2.

2. Normal Operation With Input Signal

The four transistor push-pull amplifier configuration shown in FIG. 1 constitutes, for AC operation, a common collector stage and has therefore no voltage gain, or a voltage gain close to unity. This means in first order approximation that the input voltage is equal to the output voltage neglecting AC voltage drops on the emitter-base junctions of the four transistors Q1-Q4. This common-collector stage acts basically as an impedance transformer. Its input impedance $Z_{in}$ is in good approximation given by $$Z_{in} = (h_{fe4})(h_{fe2})Z_{LC}$$

where $h_{fe4}$ and $h_{fe2}$ are the current gains of the transistors Q4, Q2, assuming $h_{fe4} = h_{fe3}$, $h_{fe2} = h_{fe1}$, and $Z_{LC}$ is the load impedance. A change in the load impedance $Z_{LC}$ is therefore reflected to the input as a corresponding change in $Z_{in}$.

The application of an AC input voltage at the point 10 through the capacitor C1 causes the complementary transistors Q1, Q2 to drive the output transistors Q3, Q4 into conduction, thus supplying power to the load impedance $Z_{LC}$. This is the well known push-pull amplifier mode of operation. Under normal operation conditions, and assuming matched transistor pairs, the direct current voltage levels at the points 10, 12 will not change. The current flowing through the driver transistors Q1, Q2 consists of the small standby direct current and (for a sinusoidal input voltage) superimposed on it a half sinewave component. The direct current component of the collector currents of the transistors Q1, Q2 will be designated I1. This current I1 will increase with increasing amplitude of the input drive voltage. As discussed above, the current I1 has to flow through the diodes D1, D2 in a direction opposite to that of the bleeder current I2 which is the normal forward current of these diodes D1, D2. The average driver direct current I1 depends now on two parameters:
1. Input drive voltage level $V_{in}$ for constant load impedance $Z_{LC}$.
2. Load impedance $Z_{LC}$ for constant input voltage.

Thus, $I1 = I1(V_{in}, Z_{LC})$, so that the current I1 increases for decreasing $Z_{LC}$ and the increasing $V_{in}$. The AC components superimposed on the average current I1 are bypassed by the capacitor C2 around the diodes D1, D2.

3. Overload Condition

If the load impedance $Z_{LC}$ assumes a small enough value, for example by an external load short circuit, the current I1 increases, and at some point it becomes equal in magnitude to the current I2. The current $I_D$ through the diodes D1 is then zero. The diodes D1, D2 are now open and nonconducting. The total picture has changed. In order to analyze it, two cases should be considered:
1. Operation without the diode D3.
2. Operation with the diode D3.

In the first case, if the diode D3 is eliminated or disconnected, the resistor R3 being relatively large acts as an additional emitter resistor for the driver transistor Q2 during the negative halfwave of the input signal voltage. In the same way, the resistor R4 limits the meximum average current for the driver transistor Q1. Even for a short circuit at the amplifier output, the current supply capability of the output transistors Q3, Q4 is therefore limited since the driver currents are limited. Thus, excessive device dissipation cannot occur in the transistors and the total battery supplied current cannot exceed a certain maximum value. In this case, the midpoint voltage at the point 12 does not deviate considerably from $V_B/2 = +15$ volts.

If the diode D3 is considered, and the difference in the diode current $I_D$ flowing through the diodes D1, D2 becomes zero at a point in time where the transistor Q2 is conducting (i.e., where its emitter-base diode is forward-biased), then the diode D3 is forward-biased by the voltage difference between the points 12, 10. Some of the current flowing from the point 12 to the negative bus 21 can now flow through the diode D3 from the point 12 to the point 10. This current through the diode D3 produces at the base biasing resistor R9 an additional voltage drop. As a result, the potential at the point 10 becomes more positive (in the order of +26 volts), and consequently the transistors Q2, Q4 are cut-off more or less. Thus the overall current capability is not only limited but actually reduced: a current-foldback occurs reducing the dissipation power to a low, safe value in the base of a short circuit.

Another way to explain this situation is as follows: The series combination of the low impedance of the forward biased diode D3 with the low load impedance $Z_{LC}$ effectively reduces or shorts out partially the input drive signal voltage.

The DC voltage level shift of the voltage at the point 10 up to a more positive value produces a corresponding upwards level shift of the midpoint voltage at the point 12, because the upper transistors Q1, Q3 are still partially conducting. One can also say that the diode D3 provides during the protection mode of operation a positive feedback from the output midpoint of the transistors Q3, Q4 to the bases of the driver transistors Q1, Q2: regenerative feedback circuit. The condition characterized by the fact that the midpoint DC voltage at the point 12 has switched to a more positive value, will be designated as "Protection Mode."

The average collector current I1 of the transistor Q2 is primarily determined by the input drive voltage level at the point 10. For a low input drive voltage, a short circuit at the output would not trigger the amplifier into the so-called "Protection Mode."

If the output circuit is triggered into the protection mode characterized by a large level shift toward more positive values of the midpoint voltage at the point 12, and if now the overload or an output short circuit is removed, the circuit remains in the protection mode ($V_{12} >> 15$). The reason for this fact is twofold. First, the drive voltage level V as the primary parameter controlling the triggering current I1 has not changed and keeps therefore the driver stages in the conditions which are characteristic for the protection mode. Second, the diode switches D1, D2 being in the open or turned-off condition, have effectively disconnected the load from the driver transistors Q1, Q2.

In summary, it can be stated: a overload condition triggers the output circuit of FIG. 1 in a protection mode which is characterized by a large shift of the midpoint voltage level at the point 12 to a more positive value. Recovery to normal operation after the removal of an overload condition does not occur automatically, but requires a reduction of the input drive voltage.

4. Overdrive Condition

Let us assume normal load impedance conditions. If the input voltage is now increased to an excessive amount (overdrive condition), the collector current I1 will increase until it equals the bleeder current I2. The diodes D1, D2 switch off and the circuit switches again into the protection mode characterized by a level shift of the midpoint voltage at the point 12 to a more positive value.

In addition to the above explanation, the following explanation is also provided. In this explanation, we have assumed that the voltage on the bus 20 is +30 volts, the voltage on the bus 21 is zero, the resistors R1, R2 are each 5,000 ohms, the resistors R3, R4 are each 200 ohms, the resistors R5, R6 are each 50 ohms, and the voltage drops across the diodes D1, D2, D3 are each 0.6 volt. It should be noted that the assumed voltage drop of 0.6 volt across the diodes D1, D2, D3 is when they conduct. The average direct current voltages under normal drive and load conditions are: the point 10 is +15 volts, the point 11 is +15.6 volts, and the point 12 is +13.8 volts. Thus, the diodes D1, D2 are normally conducting, and the diode D3 is normally nonconducting. With this normal drive and load condition, the transistor Q2 is not operating in a current limited or saturated condition, despite the resistor R3 in its emitter-collector path. The transistor Q1 is operating even less close to its current limited or saturated condition since it has no resistor corresponding to the resistor R3. If there is an overload condition, the transistors Q1, Q2 attempt to supply more drive. If there is an overdrive condition, the transistors Q1, Q2 are made to supply more drive. As an overload or overdrive condition develops, the resistor R3 limits the current in the transistor Q2 when the input voltage moves down or in a negative direction by about 12 volts, for example, whereas the current in the transistor Q1 is not limited until the input voltage moves up or in a positive direction by about 14 volts for the same example. Thus for overload or overdrive condition, the average drive current supplied by the transistor Q1 to the output transistor Q3 is considerably greater than the average drive current supplied by the transistor Q2 to the output transistor Q4. This results in the output capacitor C3 receiving a greater charge current from the transistor Q3 than the discharge current through the transistor Q4. Very quickly, the greater charge to discharge current ratio in the capacitor C3 results in a higher positive average voltage at the point 12 so that a clipped negative signal peak is supplied to the transformer T1. At about this time, the diodes D1, D2 will be reverse biased by the voltage at the point 12, removing prior electrical connection between the point 11 and the point 12. When this average voltage at the point 12 exceeds the average driving voltage at the point 10 by 0.6 volt, the diode D3 conducts. When this occurs, the transistors Q2, Q4 are turned off by the positive bias on the base of the transistor Q2. However, the transistors Q1, Q3 are driven into saturation by the same positive bias on the base of the transistor Q1. With the transistor Q3 saturated and the transistor Q4 off, the voltage at the point 12 approaches the voltage on the positive bus 20, less cumulative saturation voltage drops across the transistors Q1, Q3, or approximately +26 VDC. Thus the transistors Q1, Q3 dissipation is limited by available collector to emitter voltage (about 4 volts), and the transistors Q2, Q4 dissipation is limited by reverse bias on the base-emitter junction of the transistor Q2.

At this point then, the voltage at the point 12 may be close to the positive battery voltage, or about +26 volts, and is held at this high magnitude as long as any input signal is applied. This is because the transistors Q2, Q4 are turned off and the transistors Q1, Q3 conduct during the peaks of positive input signals. Hence, the capacitor C3 never fully discharges, and thereby maintains the high positive voltage at the point 12. Even if there is no overload, this protective condition will continue unless the input signal is reduced by about 50% to 75% or the overload is removed long enough for the capacitor C3 to discharge through the resistor R4 or the transistor Q4. In audio applications, the music or speech may stop long enough to achieve this. However, if the amplifier is used in an application in which the input signals are continuous, such as a signaling tone or carrier for the power line carrier systems mentioned earlier, it will be appreciated that once the amplifier goes into its protected condition, it will remain in that condition even though the overload or overdrive is removed. Thus, the amplifier may become useless. Accordingly, we have provided an additional circuit for restoring the amplifier of FIG. 1 and the amplifier shown in U.S. Pat. No. 3,596,199. This restoring circuit includes a threshold device 14 having its input connected to the point 12 and its output connected to the variable attenuator 13. The threshold device 14 is arranged to sense the relatively high voltage at the point 12, indicating an overload or overdrive condition. When this voltage reaches a selected magnitude determined by the threshold device 14, the device 14 applies an output signal to a control input of the variable attenuator 13 to attenuate or reduce the input signal. Thus, when the overload or overdrive condition is removed, the input signal is reduced long enough to permit capacitor C3 to discharge. The voltage at the point 12 falls to a normal value, the threshold device 14 opens, and the normal operation is resumed. Of course, if the overload or overdrive is still present, the protective condition will take place again. If the overload or overdrive condition is sustained, the amplifier dissipation will equalize at some point between the protection level (without the threshold device 14) and full capability. The exact point of equalization is determined by the gain of the variable attenuator 13. The threshold device 14 and the attenuator 13 may take various forms. Thus, we provide an amplifier having all of the desired characteristics of known amplifiers but having a protection circuit which is reliably self-restoring.

Figure 2:
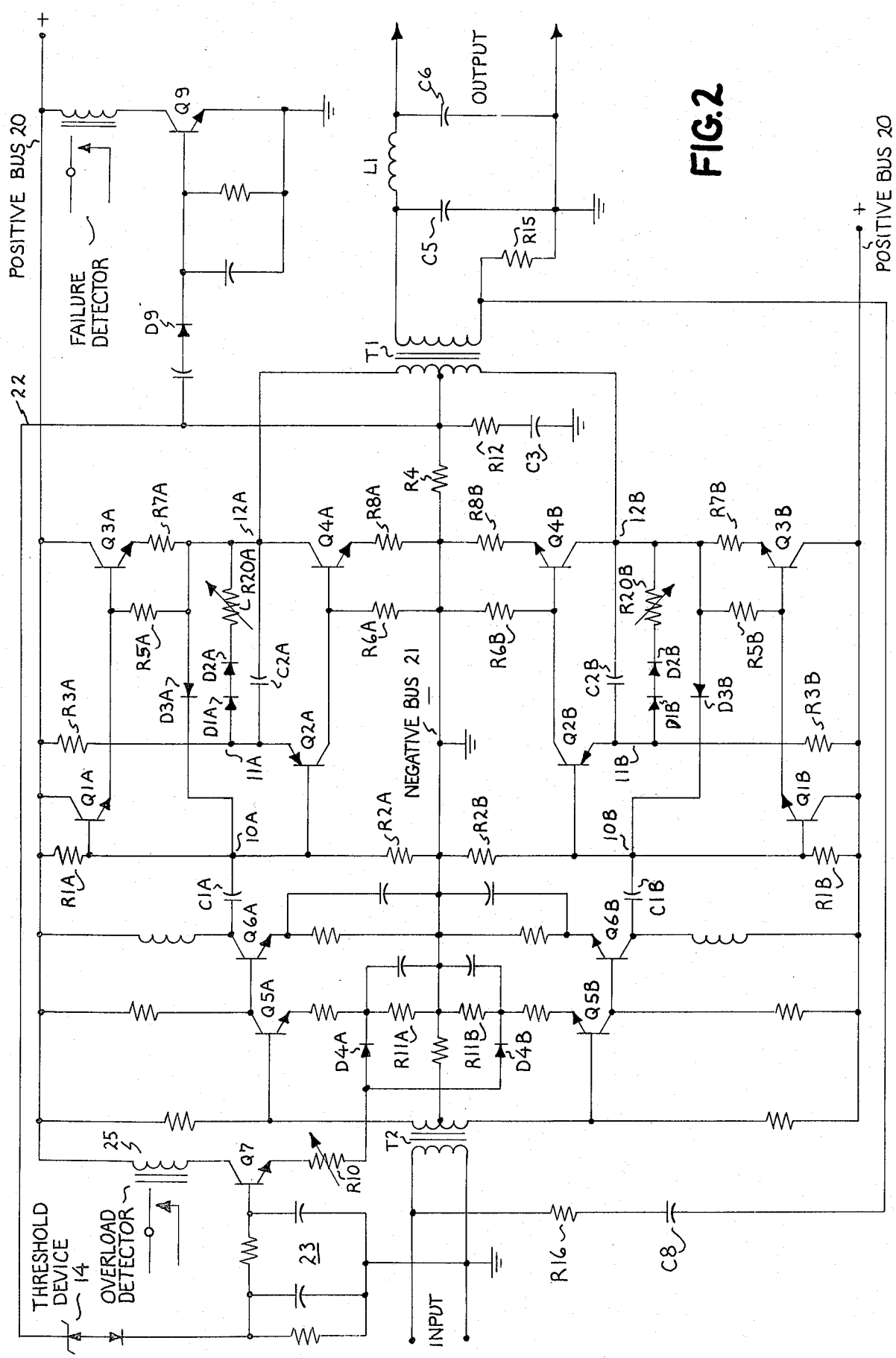
FIG. 2 shows a circuit diagram of a second embodiment of an amplifier in accordance with our invention.

FIG. 2 shows a circuit diagram of a second embodiment of the amplifier in accordance with our invention. The amplifier of FIG. 2 includes a redundant bridge arrangement. That is, two of the amplifiers of FIG. 1 are connected in a push-pull bridge circuit. Hence, in FIG. 2, circuit elements corresponding to those of FIG. 1 have been given the same reference numeral or designation followed by the suffix A for the upper amplifier, and followed by the suffix B for the lower amplifier. In operation, when the point 10A is positive and the point 10B is negative, the transistors Q1A, Q3A and Q2B, Q4B conduct, and output current flows from the point 12A through the entire primary winding of the transformer T1 to the point 12B. When the point 10B is positive and the point 10A is negative, the transistors Q1B, Q3B and Q2A, Q4A conduct, and output current flows from the point 12B through the entire primary winding of the transformer T1 to the point 12A. Thus, except in cases of unbalance, no current flows in the capacitor C3 and a small resistor R12 which are connected in series between the center tap of the primary winding of the transformer T1 and the negative bus 21 (or ground). At the amplifier input side of the points 10A, 10B, push-pull operation is provided by an input transformer T2. Additional variable gain amplification is provided by transistors Q5A, Q5B in the first stage of each amplifier, and by the transistors Q6A, Q6B in the second stage of each amplifier. The outputs from the transistors Q6A, Q6B are respectively connected through capacitors C1A, C1B to the input points 10A, 10B. The protective operation of the amplifier of FIG. 2 is the same as that of FIG. 1. However, it should be noted that since the center tap of the primary winding of the output transformer T1 is at the same direct current voltage as the points 12A, 12B, the resistor R4 serves to bias both sets of diodes D1A, D2A and D1B and D2B. The center tap is connected through a line 22 to the threshold device 14, which is shown as a zener diode. This diode is nonconducting during a normal operation. The zener diode is connected to a variable attenuator which comprises a filter circuit 23 for providing a relatively steady state direct current voltage in response to conduction of the zener diode 14. The filter circuit output is applied to a normally nonconducting variable attenuator transistor Q7 whose collector may be connected to the positive bus 20 through an overload or overdrive detector which comprises a relay 25. The emitter of the transistor Q7 is connected through a variable resistor R10 to diodes D4A, D4B respectively, and biasing resistors R11A, R11B respectively. It will be seen that the amount of current conducted by the attenuator transistor Q7 determines the bias supplied to the transistors Q5A, Q5B. If overload or overdrive occurs, the points 12A, 12B and the line 22 become very positive, as described in connection with FIG. 1. The zener diode breaks down and turns on the transistor Q7. Conduction of the transistor Q7 produces a voltage drop across the resistors R11A, R11B which biases the transistors Q5A, Q5B toward less conduction, so as to attenuate signals applied to and amplified by these transistors Q5A, Q5B. Conduction by the transistor Q7 may also operate the overload or overdrive detector relay 25 whose contacts can provide a visual, audible, or other indication that the protective circuit was operated. The relay 25 may, of course, be an electronic device.

In addition to our new and improved restoration circuit for the amplifier, we also provide other features. Thus, at the output of the amplifier, we provide a failure detector circuit which is connected to the center tap of the primary winding of the transformer T1. This circuit utilizes the resistor R12 and the capacitor C4 for sensing any alternating current voltage which may be present at the center tap of the primary winding. Any such alternating current at the center tap indicates an unbalance or improper operation in the amplifier, and this alternating current voltage may be applied to any sort of desired failure detector, such as a diode D9, a filter circuit, and a transistor Q9 which operates a relay or electronic indicating device in response to failure or unbalance.

At the secondary winding of the transformer T1, we provide a transient or over-voltage protective circuit utilizing metal oxide varistors C5, C6, shown as capacitors because of their inherent properties. These varistors C5, C6 protect the amplifier from high voltage transients or surges, which may occur in the output circuit, from being transmitted back through the amplifier. The capacity of the varistors C5, C6 is relatively large so that an inductor L1 of proper size is provided to form an LC circuit which compensates in the lower frequency range the relatively large capacity. At higher frequencies, the varistor C5 contributes to amplifier stabilization.

And finally, we provide an impedance matching circuit comprising a resistor R15 connected between one end of the secondary winding of the transformer T1 and the common output line or ground. Output current develops a voltage across this resistor R15 which is fed back through a capacitor C8 and a resistor R16 to the input primary winding of the transformer T2 to provide control of the amplifier output impedance. Thus, the amplifier of FIG. 2 represents a new and improved circuit which has all of the desired features of the prior art protection, but has the added restoral circuit, the redundant bridge arrangement, the overload detector, the failure detector, protection against high voltage transients coming from the load (power lines), and the current feedback loop for impedance control. It should be noted that the protection mode is also triggered by high-voltage transients. Some amplification is provided by either an upper or lower amplifier even though the other fails completely.

Figure 3A:
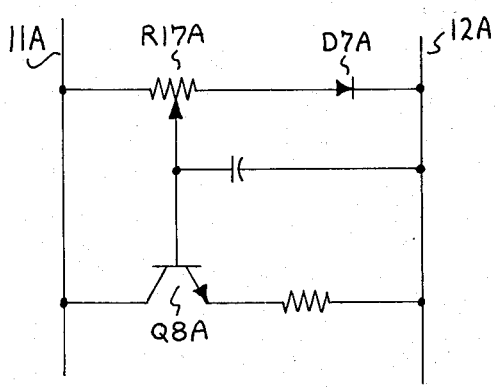
FIGS. 3A and 3B show modifications which may be used in the amplifier of FIG. 2.
Figure 3B:
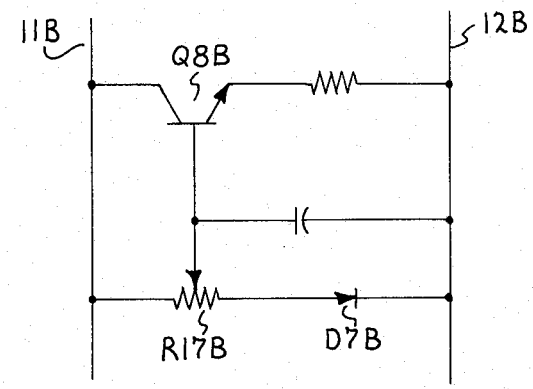

The amplifier of FIG. 2 has been built and constructed to produce output signals as high as 200 watts between frequencies of 8 and 500 kilohertz. However, where the amplifier is used for relatively low output power, in the order of 5 or 10 watts, we have found that the resultant reduced current flowing in the diodes D1A, D2A and D1B, D2B is insufficient to maintain the needed voltage drop for linear operation of the driver transistors Q1A, Q2A, Q1B, Q2B. Accordingly, we have provided a modification for FIG. 2 to provide proper operation under this reduced power. This modification is shown in the circuit of FIG. 3A and 3B. The circuit of FIG. 3A is intended to replace the diodes D1A, D2A and resistor R20A of FIG. 2, and the circuit of FIG. 3B is intended to replace the diodes D1B, D2B and resistor R20B of FIG. 2. These circuits include tapped resistors R17A, R17B and hot carrier diodes D7A, D7B. The diodes D7A, D7B will conduct on a relatively low current flowing through the resistors R17A, R17B as a result of the low power. The transistors Q8A, Q8B are small signal devices which can be adjusted from saturation to cutoff to provide the desired circuit voltages. In addition to the embodiments shown, persons skilled in the art will appreciate that modifications may be made to these embodiments. For example, the amplifiers may handle various amounts of power, the main limitations being the power handling ability of the output transistors Q3, Q4, and the output transformer T1. The frequency handling characteristics may be determined in part by the characteristics of the output transformer T1. The output transistors Q3, Q4 may be operated class B, or class AB, or class A. And the exact number of diodes used may be varied in accordance with the desired voltage drop. Therefore, while our invention has been described with reference to particular embodiments, it is to be understood that modifications may be made without departing from the spirit of the invention or from the scope of the claims.

What we claim as new and desire to secure by Letters Patent of the United States is:

1. In a transistorized power amplifier comprising:
   a. an input for said amplifier;
   b. a pair of complementary input transistors connected to said input to supply oppositely phased signals in response to an input signal applied to said amplifier input;
   c. a pair of output transistors having input circuits respectively connected to said complementary input transistors, said output transistors being responsive respectively to said oppositely phased signals to provide output signals for said amplifier;
   d. normally conductive switching means connected between one of said output transistors and one of said complementary input transistors;
   e. normally nonconductive switching means connected between said one output transistor and said amplifier input;
   f. said normally conductive switching means becoming nonconductive in response to an overload or an overdrive applied to said amplifier, and said normally nonconductive switching means becoming conductive in response to said normally conductive switching means becoming nonconductive; an improved restoral circuit comprising:
   g. a threshold device having an input connected to said one output transistor and having an output that produces a threshold signal in response to a predetermined voltage at its input;
   h. and an attenuator connected to said amplifier input, said attenuator having a control input connected to said threshold output for reducing the magnitude of input signals applied to said amplifier input in response to said threshold signal.

2. A transistorized power amplifier comprising:
   a. an input for said amplifier;
   b. a first pair of complementary input transistors connected to said amplifier input to supply oppositely phased signals in response to an input signal applied to said amplifier input;
   c. a second pair of complementary input transistors connected to said amplifier input to supply oppositely phased signals in response to an input signal applied to said amplifier input;
   d. a first pair of output transistors connected in series and having input circuits respectively connected to said first pair of complementary input transistors, said first pair of output transistors being responsive respectively to oppositely phased signals to provide output signals for said amplifier;
   e. a second pair of output transistors connected in series and having input circuits respectively connected to said second pair of complementary input transistors, said second pair of output transistors being responsive respectively to said oppositely phased signals to provide output signals for said amplifier;
   f. first normally conductive switching means connected between one of said first pair of output transistors and one of said first pair of complementary input transistors;
   g. second normally conductive switching means connected between one of said second pair of output transistors and one of said second pair of complementary input transistors;

h. first normally nonconductive switching means connected between said one of said first pair of output transistors and said amplifier input;
i. second normally nonconductive switching means connected between said one of said second pair of output transistors and said amplifier input;
j. said normally conductive switching means becoming nonconductive in response to an overload or an overdrive applied to said amplifier, and said normally nonconductive switching means becoming conductive in response to said normally conductive switching means becoming nonconductive;
k. a threshold device having an input connected to said one output transistor of said first and second pairs of output transistors and having an output that produces a threshold signal in response to a selected voltage at its input;
l. and an attenuator connected to said amplifier input, said attenuator having a control input connected to said threshold device output for reducing the magnitude of input signals applied to said amplifier in response to said threshold signal.

3. The amplifier of claim 2 and further comprising: an output transformer connected between the series junction of said first pair of output transistors and the series junction of said second pair of output transistors, and wherein said threshold device input is connected to a center tap of said output transformer.

4. The amplifier of claim 3, and further comprising a device for detecting alternating current at said output transformer center tap for indicating failure.

5. In a transistor amplifier comprising:
a. a driver stage including a pair of transistors having a common signal input point and responsive to signals applied thereto to produce a pair of oppositely phased output signals;
b. an output stage including a pair of series connected class B transistors having an output load point at a junction therebetween and each having an input connected to one of said driver stages respectively for producing an output signal at said output load point in response to said oppositely phased signals produced by said driver stage;
c. a protective circuit comprising:
  1. a first diode circuit having its anode biased by a positive potential and its cathode biased by a negative potential;
  2. means connecting said first diode circuit cathode to said output load point;
  3. a second diode circuit having its anode connected to said output load point and its cathode connected to said common signal input point of driver stage; an improved restoral circuit comprising:
d. a threshold device having an input connected to said output load point and having an output for producing a threshold signal in response to said output load point reaching a predetermined positive voltage magnitude;
e. and an attenuator connected to said common input point of said driver stage, said attenuator having a control connected to said threshold device for reducing the amplitude of input signals at said common input point of said driver stage to a predetermined low magnitude in response to threshold signals.

6. A transistor amplifier comprising:
a. a first driver stage including a pair of transistors having a common signal input point and responsive to signals applied thereto to produce a pair of oppositely phased output signals;
b. a second driver stage including a pair of transistors having a common signal input point and responsive to signals applied thereto to produce a pair of oppositely phased output signals;
c. a first output stage including a pair of series connected transistors having a first output load point at a junction therebetween and each having an input connected to one of said transistors respectively of said first driver stage for producing an output signal at said first output load point in response to said oppositely phased signals produced by said first driver stage;
d. a second output stage including a pair of series connected transistors having a second output load point at a junction therebetween and each having an input connected to one of said transistors respectively of said second driver stage for producing an output signal at said second output load point in response to said oppositely phased signals produced by said second driver stage;
e. a first protective circuit comprising:
  1. a first diode circuit havings it anode biased by a positive potential and its cathode biased by a negative potential;
  2. means connecting said first diode circuit cathode to said first output load point of said first output stage;
  3. a second diode circuit having its anode connected to said first output load point of said first output stage and its cathode connected to said common input point of said first driver stage;
f. a second protective circuit comprising:
  1. a third diode circuit having its anode biased by a positive potential and its cathode biased by a negative potential;
  2. means connecting said third diode circuit cathode to said second output load point of said second output stage;
  3. a fourth diode circuit having its anode connected to said second output load point of said second output stage and its cathode connected to said common input point of said second driver stage;
g. a threshold device having an input connected to said first and second output load points of said first and second output stages and having an output for producing a threshold signal in response to at least one of said output load points reaching a predetermined positive voltage magnitude;
h. and an attenuator connected to said common input points of said first and second driver stages, said attenuator having a control input connected to said threshold device for reducing the magnitude of input signals at said common input points of said driver stages to a predetermined low magnitude in response to threshold signals.

7. The transistor amplifier of claim 6, and further comprising an output transformer connected between said first output load point of said first output stage and said second output load point of said second output stage, and wherein said threshold device input is connected to a center tap of said output transformer.

8. The transistor amplifier of claim 7, and further comprising a device for detecting alternating current at said output transformer center tap for indicating failure of said amplifier.

9. The transistor amplifier of claim 8, and further comprising a varistor and inductor circuit connected to said output transformer for providing protection and stability to said transistor amplifier, and a current sensing circuit connected between said output transformer and said common input points of said driver stages for adjusting the output impedance of said transistor amplifier.

* * * * *